United States Patent
Kim et al.

(10) Patent No.: US 7,561,486 B2
(45) Date of Patent: Jul. 14, 2009

(54) FLASH MEMORY DEVICES WITH FLASH FUSE CELL ARRAYS

(75) Inventors: Tae-Seong Kim, Yong in-Si (KR); Gyu-Hong Kim, Yongin-si (KR)

(73) Assignee: Samsung Electronics Co., Ltd. (KR)

( * ) Notice: Subject to any disclaimer, the term of this patent is extended or adjusted under 35 U.S.C. 154(b) by 162 days.

(21) Appl. No.: 11/346,520

(22) Filed: Feb. 2, 2006

(65) Prior Publication Data
US 2006/0176740 A1   Aug. 10, 2006

(30) Foreign Application Priority Data
Feb. 4, 2005   (KR) ...................... 10-2005-0010338

(51) Int. Cl.
*G11C 17/18* (2006.01)
(52) U.S. Cl. .................... 365/225.7; 365/200; 365/196; 365/205; 365/207
(58) Field of Classification Search ................ 365/200, 365/225.7, 196, 205, 207
See application file for complete search history.

(56) References Cited

U.S. PATENT DOCUMENTS

| | | | | |
|---|---|---|---|---|
| 6,229,731 B1* | 5/2001 | Kasai et al. | ............ | 365/185.04 |
| 6,385,074 B1* | 5/2002 | Johnson et al. | ............ | 365/103 |
| 6,553,510 B1* | 4/2003 | Pekny | ............ | 714/6 |
| 6,992,937 B2* | 1/2006 | Tran et al. | ............ | 365/200 |
| 7,120,053 B2* | 10/2006 | Atsumi et al. | ............ | 365/185.04 |
| 2002/0061606 A1* | 5/2002 | Honma et al. | ............ | 438/14 |
| 2004/0208071 A1* | 10/2004 | Mukunoki et al. | ............ | 365/201 |
| 2005/0024956 A1* | 2/2005 | Tran et al. | ............ | 365/200 |
| 2005/0117406 A1* | 6/2005 | Atsumi et al. | ............ | 365/189.05 |
| 2005/0237842 A1* | 10/2005 | Takeuchi et al. | ............ | 365/225.7 |
| 2006/0171205 A1* | 8/2006 | Bang et al. | ............ | 365/185.21 |
| 2006/0176740 A1* | 8/2006 | Kim et al. | ............ | 365/185.33 |

FOREIGN PATENT DOCUMENTS

JP   10-302476   11/1998

(Continued)

OTHER PUBLICATIONS

Notice to Submit a Response for Korean Patent Application No. 10-2005-0010338 on May 22, 2006.

*Primary Examiner*—Thong Q Le
(74) *Attorney, Agent, or Firm*—Myers Bigel Sibley & Sajovec

(57) ABSTRACT

A flash memory device includes a flash cell array, a first flash fuse cell fusing circuit, a second flash fuse cell fusing circuit, a third flash fuse cell fusing circuit and a plurality of fuse sense amplifying circuits. The first, second and third flash fuse cell fusing circuits all share bit lines with a flash cell array and have flash fuse cells. The first flash fuse cell fusing circuit may be used to control a connection between the flash cell array and an external logic circuit. The second flash fuse cell fusing circuit may be used to change an address of a defective cell into an address of a redundancy cell. The third flash fuse cell fusing circuit may be used to control a DC level for adjusting a reference value used in a manufacturing process of the flash memory device. The fuse sense amplifying circuits are coupled to the bit lines to read data from the bit lines, respectively.

11 Claims, 3 Drawing Sheets

FOREIGN PATENT DOCUMENTS

| | | | |
|---|---|---|---|
| JP | 2001273781 A | * | 10/2001 |
| JP | 2005-310285 | * | 11/2005 |
| KR | 1990-10773 | | 7/1990 |
| KR | 1997-17691 | | 4/1997 |
| KR | 1999-5916 | | 1/1999 |
| KR | 2005-8052 | * | 1/2005 |

* cited by examiner

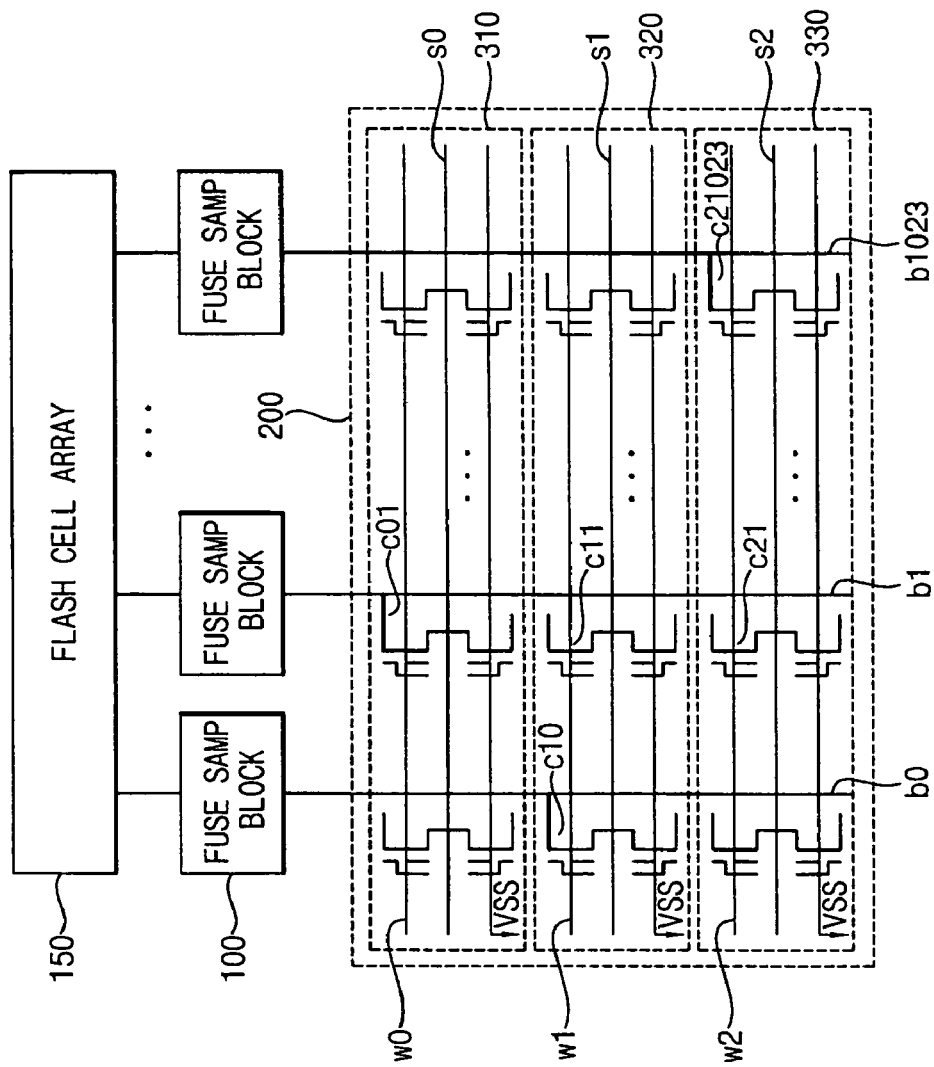

FLASH MEMORY DEVICES WITH FLASH FUSE CELL ARRAYS

CLAIM FOR PRIORITY

This application claims priority under 35 U.S.C. § 119 from Korean Patent Application No. 2005-10338, filed on Feb. 4, 2005 in the Korean Intellectual Property Office (KIPO), the disclosure of which is hereby incorporated by reference herein as if set forth in its entirety.

FIELD OF THE INVENTION

The present invention relates to the field of semiconductor devices and, more particularly, to flash memory devices.

BACKGROUND

FIG. 1 is a block diagram of a conventional flash memory device. As shown in FIG. 1, the flash memory device 1 includes a flash cell array 6, a protective circuit 4, a first peripheral circuit 2, and a second peripheral circuit 8. The flash cell array 6 is a data storage device that includes a plurality of flash memory cells. These flash cells may comprise, for example, static gate type flash cells, split gate type flash cells or any other type of flash memory cell. The protective circuit 4 may be used to control the use of the flash memory device when the flash cell array is connected to an external logic circuit. The protective circuit 4 may include an array of metal fuses that are set (i.e., cut or not cut) so as to control the use of the flash memory device in a desired fashion.

The first peripheral circuit 2 is used to change the address of a defective cell in the flash cell array 6 into the address of a redundancy cell. Such a capability is provided because one or more cells in the flash cell array may be defective. When a defective cell is detected, the first peripheral circuit 2 changes the address of the defective cell into the address of one of the redundancy cells in order to "replace" the defective cell with one of the redundancy cells. The first peripheral circuit 2, like the protective circuit 4, may include an array of metal fuses. The address of the redundancy cell is changed to the address of the defective cell by cutting one of the metal fuses of the first peripheral circuit 2 using, for example, a laser bean.

The second peripheral circuit 8 controls the DC level so that desired reference values may be provided irrespective of the manufacturing processing conditions used during the fabrication of the flash memory device (which may impact the DC levels provided). The second peripheral circuit 8 may also include an array of metal fuses. In order to provide reference values regardless of semiconductor manufacturing processes of the flash memory, the second peripheral circuit 8 minutely controls a connection of the metal fuse according to respective conditions, and provides a fixed reference value(s).

SUMMARY

Some embodiments of the present invention provide flash memory devices which include a fuse cell array having a at least one fusing circuit that are implemented with flash fuse cells. The flash memory devices according to some embodiments of the present invention may sense and/or fuse the fusing circuits simultaneously.

Pursuant to some embodiments of the present invention, flash memory devices are provided that include a flash cell array, a first flash fuse cell fusing circuit, a second flash fuse cell fusing circuit and a third flash fuse cell fusing circuit. The flash cell array has a plurality of flash memory cells. The first flash fuse cell fusing circuit includes a plurality of flash fuse cells and shares bit lines with the flash cell array. The first flash fuse cell fusing circuit is configured to control a connection between the flash cell array and an external logic circuit. The second flash fuse cell fusing circuit includes a plurality of flash fuse cells and also shares the bit lines with the flash cell array. The second flash fuse cell fusing circuit is configured to change an address of a defective cell of the flash cell array into an address of a redundancy cell. The third flash fuse cell fusing circuit includes a plurality of flash fuse cells and further shares the bit lines with the flash cell array. The third flash fuse cell fusing circuit is configured to control a DC level for an operation of the flash memory device. The fuse sense amplifying circuits are coupled to the bit lines, and read data from the bit lines, respectively. Each of the fuse sense amplifying circuits may comprise a sense amplifier that is configured to amplify data on the at least one of the bit lines, and a latch that is configured to store an output of the sense amplifier.

In further embodiments, the first flash fuse cell fusing circuit may comprise a first block of flash fuse cells having gates that are connected to a first word line, and a second block of flash fuse cells having gates that are connected to a second word line. The sources of the flash fuse cells of both the first block of flash fuse cells and the second block of flash fuse cells may be connected to a first source line, and the second word line may be connected to a reference voltage. The second flash fuse cell fusing circuit may comprise a third block of flash fuse cells having gates that are connected to a third word line, and a fourth block of flash fuse cells having gates that are connected to a fourth word line. The sources of the flash fuse cells of both the third block of flash fuse cells and the fourth block of flash fuse cells may be connected to a second source line, and the fourth word line may be connected to the reference voltage. The third flash fuse cell fusing circuit may comprise a fifth block of flash fuse cells having gates that are connected to a fifth word line, and a sixth block of flash fuse cells having gates that are connected to a sixth word line. The sources of the flash fuse cells of both the fifth block of flash fuse cells and the sixth block of flash fuse cells may be connected to a third source line, and the sixth word line may be connected to the reference voltage.

Pursuant to further embodiments of the present invention, flash memory devices are provided that include a flash cell array having a plurality of flash memory cells, a fuse cell array having a plurality of fusing circuits formed with flash fuse cells and a plurality of bit lines that are shared by the flash cell array and to the fuse cell array. The drain of only one of the flash fuse cells of the first fusing circuit, the second fusing circuit, and the third fusing circuit is electrically connected to the corresponding bit line that is shared by the flash cell array and to the fuse cell array. Both a word line and a source line of the fusing circuits in the fuse cell array are separated, so that the flash fuse cells of each fusing circuit may be simultaneously programmed and/or erased.

In these devices, the fuse cell array may be configured to (1) control a DC level for an operation of the flash memory device, (2) to control a connection to an external logic circuit and/or (3) to change an address of a defective flash fuse cell in the flash cell array into an address of a redundancy cell. The flash memory devices may also include a fuse sense amplifying circuit, connected to the bit lines, that is configured to read data from the bit lines.

Pursuant to still further embodiments of the present invention, methods of configuring a flash memory device that includes a flash cell array are provided in which at least some of the flash fuse cells of (1) a first fusing circuit that is configured to control a connection between the flash cell array and an external circuit and (2) a second fusing circuit that is configured to change the address of a defective flash cell in the flash cell array to the address of a redundancy flash cell or (3) a third fusing circuit that is configured to control a DC voltage level applied to internal circuits of the flash memory device are simultaneously activated.

BRIEF DESCRIPTION OF THE DRAWINGS

FIG. 4 is a circuit diagram of a flash memory device according to second embodiments of the present invention.

DETAILED DESCRIPTION

Figure 1:
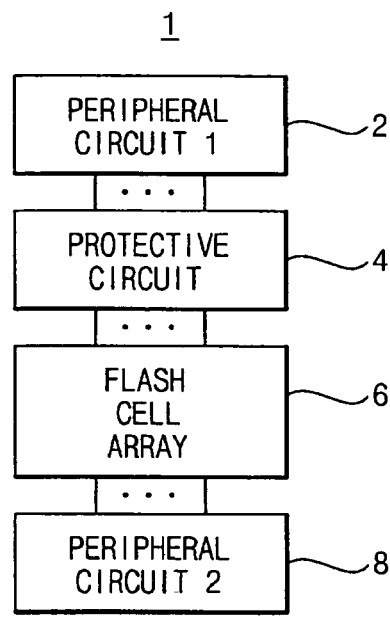
FIG. 1 is a block diagram of a conventional flash memory device.

Embodiments of the present invention now will be described more fully hereinafter with reference to the accompanying drawings, in which embodiments of the invention are shown. This invention may, however, be embodied in many different forms and should not be construed as limited to the embodiments set forth herein. Rather, these embodiments are provided so that this disclosure will be thorough and complete, and will fully convey the scope of the invention to those skilled in the art. Like numbers refer to like elements throughout.

It will be understood that, although the terms first, second, etc. may be used herein to describe various elements, these elements should not be limited by these terms. These terms are used to distinguish one element from another. For example, a first element could be termed a second element, and, similarly, a second element could be termed a first element, without departing from the scope of the present invention. As used herein, the term "and/or" includes any and all combinations of one or more of the associated listed items.

It will be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present. Other words used to describe the relationship between elements should be interpreted in a like fashion (e.g., "between" versus "directly between", "adjacent" versus "directly adjacent", etc.).

The terminology used herein is for the purpose of describing particular embodiments and is not intended to be limiting of the invention. As used herein, the singular forms "a", "an" and "the" are intended to include the plural forms as well, unless the context clearly indicates otherwise. It will be further understood that the terms "comprises" "comprising," "includes" and/or "including" when used herein, specify the presence of stated features, integers, steps, operations, elements, and/or components, but do not preclude the presence or addition of one or more other features, integers, steps, operations, elements, components, and/or groups thereof.

Unless otherwise defined, all terms (including technical and scientific terms) used herein have the same meaning as commonly understood by one of ordinary skill in the art to which this invention belongs. It will be further understood that terms used herein should be interpreted as having a meaning that is consistent with their meaning in the context of this disclosure and the relevant art and will not be interpreted in an idealized or overly formal sense unless expressly so defined herein.

Hereinafter, example embodiments of the present invention will be described in detail with reference to the accompanying drawings in order to enable one of ordinary skill in the art to practice the present invention.

Figure 2:
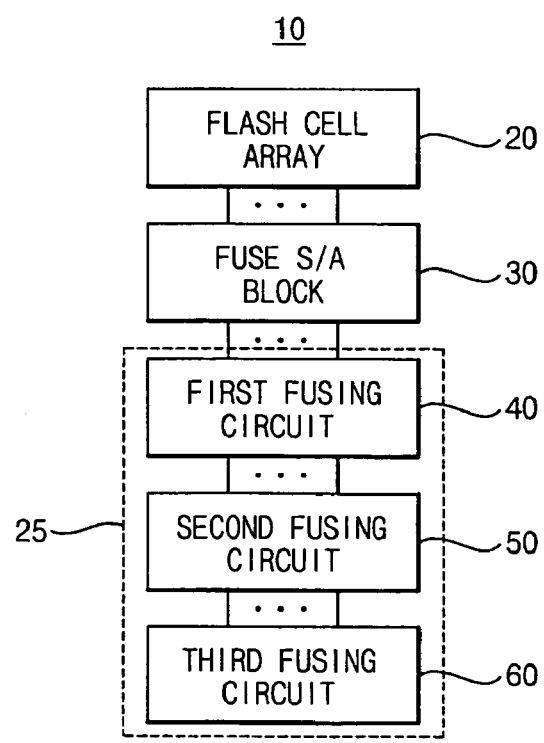
FIG. 2 is a block diagram of a flash memory device according to embodiments of the present invention.

FIG. 2 is a block diagram illustrating a flash memory device according to embodiments of the present invention. As shown in FIG. 2, the flash memory device 10 may include a flash cell array 20, a fuse sense amplifying circuit 30, and a fuse cell array 25. The fuse cell array 25 may include a first fusing circuit 40, a second fusing circuit 50 and a third fusing circuit 60. The fusing circuits 40, 50 and 60 perform the same function as the arrays of metal fuses that are respectively included in the protective circuit 4, the first peripheral circuit 2, and the second peripheral circuit 8 of FIG. 1.

The flash cell array 20 is used as a storage medium that stores information in respective flash memory cells. The first fusing circuit 40 may be used to store basic information. The first fusing circuit 40 may also be used to change a connection between an external logic circuit and the flash cell array 20. It will be appreciated that the external logic circuit may be on the same semiconductor chip as the flash memory device or may be on a separate semiconductor chip.

When one of the cells in the flash cell array 20 is identified as being defective, the second fusing circuit 50 may be used to select one of a plurality of redundancy cells that may be included, for example, in the flash cell array 20. In order to replace the defective cell, the second fusing circuit 50 may be used to change the address of the defective cell into the address of a selected one of the redundancy cells. According to embodiments of the present invention, the second fusing circuit 50 is implemented with a flash fuse cell. As flash fuse cells may be reprogrammed, if an error is identified after the second fusing circuit 50 is programmed, the second fusing circuit 50 may be erased and reprogrammed to correct the error.

The third fusing circuit 60 may be used to control a DC level so that desired reference values may be provided irrespective of the manufacturing processing conditions used during the fabrication of the flash memory device (which may impact the DC levels provided). The DC level may be controlled by programming the third fusing circuit 60 to provide the desired DC levels. The third fusing circuit 60 may also be implemented using flash fuse cells. Since such flash fuse cells may be erased and reprogrammed, if the DC level that is provided is greater or smaller than a desired value, the third fusing circuit 60 may be reprogrammed to provide the desired value.

The fuse sense amplifying circuit 30 receives and amplifies information from the first fusing circuit 40, the second fusing circuit 50 and the third fusing circuit 60, and then outputs the amplified information.

Figure 3:
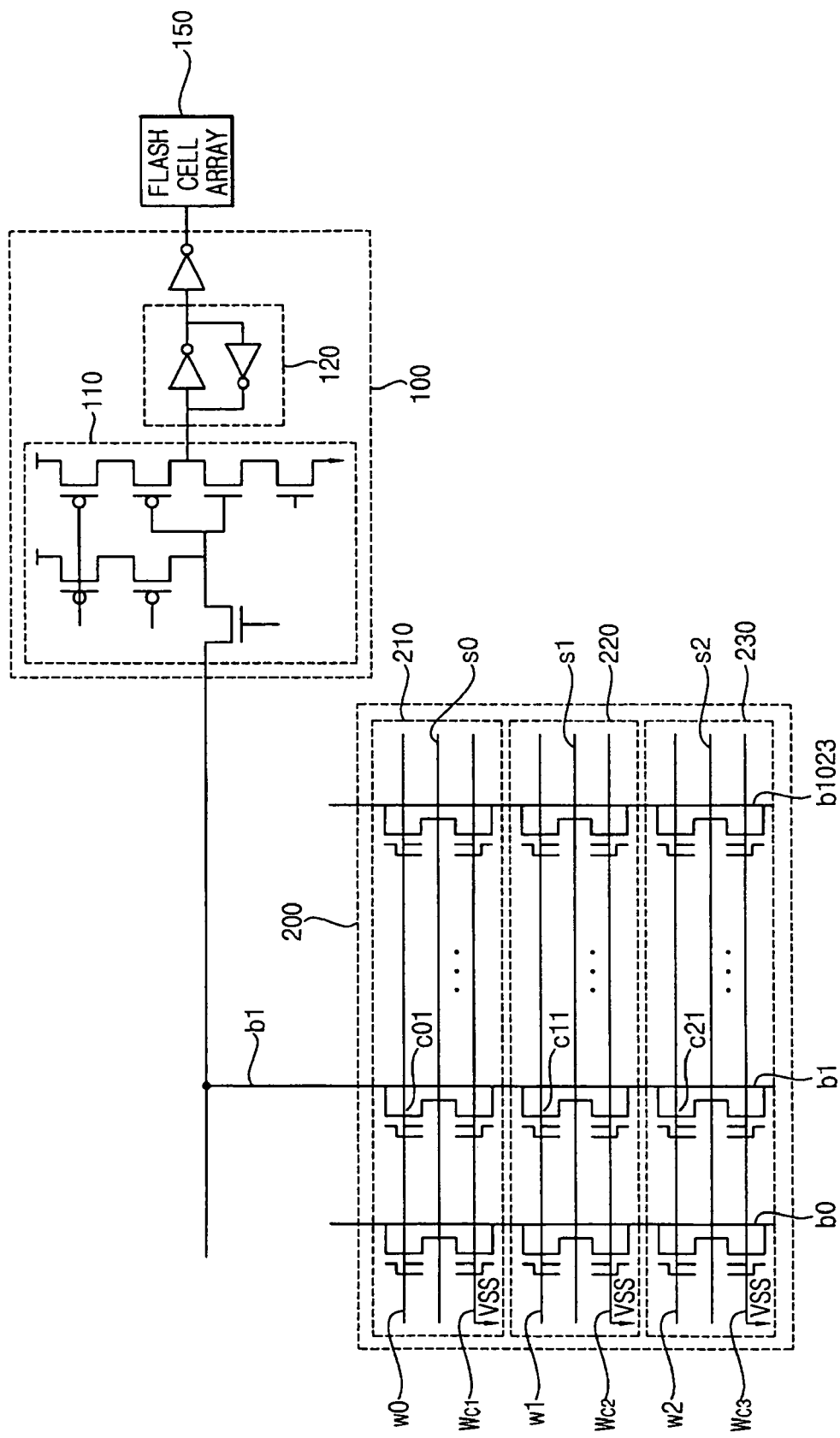
FIG. 3 is a circuit diagram of a flash memory device according to first embodiments of the present invention.

FIG. 3 is a circuit diagram illustrating a flash memory device according to first embodiments of the present invention. As shown in FIG. 3, the flash memory device may include a flash cell array 150, a fuse sense amplifying circuit 100 and a fuse cell array 200. The fuse cell array 200 may include a first fusing circuit 210, a second fusing circuit 220 and a third fusing circuit 230. The fuse sense amplifying unit 100 is connected to respective bit lines b0, b1, ..., b1023. In order to simplify FIG. 3, only a single fuse sense amplifying circuit 150 is shown (the one connecting bit line b1 to the flash cell array 150). It will be understood however, that a plurality of fuse sense amplifying circuits 150 would be provided (e.g., one for each bit line). In FIG. 3, the first fusing circuit 210, the second fusing circuit 220 and the third fusing circuit 230 are implemented using flash fuse cells. The fuse cell array 200 may be implemented using a conventional method for manufacturing a flash memory cell array. As shown in FIG. 3, in the conventional flash memory cell array that may be used as the fuse cell array 200, two transistors have a shared source and respective drains connected to a common bit line.

As shown in FIG. 3, the first fusing circuit 210 includes first and second flash fuse cell blocks that each include a plurality of flash fuse cells. The gates of the flash fuse cells of the first flash fuse cell block are connected to a first word line w0, and the sources of the flash fuse cells of the first flash fuse cell block are connected to a source line s0. The gates of the flash fuse cells of the second flash fuse cell block are connected to a first common word line Wc1, and the sources of the flash fuse cells of the second flash fuse cell block are connected to the source line s0. Since the first fusing circuit 210 only uses flash fuse cells connected to the first word line w0, the first common word line Wc1 is connected to a ground voltage VSS.

The second fusing circuit 220 includes third and fourth flash fuse cell blocks that each include a plurality of flash fuse cells. As shown in FIG. 3, the gates of the flash fuse cells of the third flash fuse cell block are connected to a second word line w1, and the sources of the flash fuse cells of the third flash fuse cell block are connected to a source line s1. The gates of the flash fuse cells of the fourth flash fuse cell block are connected to a second common word line Wc2, and the sources of the flash fuse cells of the fourth flash fuse cell block are connected to the source line s1. Since the second fusing circuit 220 only uses flash fuse cells connected to the second word line w1, the second common line Wc2 is connected to the ground voltage VSS.

The third fusing circuit 230 includes fifth and sixth flash fuse cell blocks that each include a plurality of flash fuse cells. As shown in FIG. 3, the gates of the flash fuse cells of the fifth flash fuse cell block are connected to a third word line w2, and the sources of the flash fuse cells of the fifth flash fuse cell block are connected to a source line s2. The gates of the flash fuse cells of the sixth flash fuse cell block are connected to a third common word line Wc3, and the sources of the flash fuse cells of the sixth flash fuse cell block are connected to the source line s2. Since the third fusing circuit 230 only uses flash fuse cells connected to the third word line w2, the third common line Wc3 is connected to the ground voltage VSS.

The first fusing circuit 210, the peripheral circuit 220 and the third fusing circuit 230 share bit lines. For example, as shown in FIG. 3, bit line b1 is connected to flash fuse cell c01 of first fusing circuit 210, to flash fuse cell c11 of the second fusing circuit 220, and to flash fuse cell c21 of the third fusing circuit 230. The remaining bit lines may likewise be connected to respective flash fuse cells of first fusing circuit 210, second fusing circuit 220 and third fusing circuit 230. In the embodiment of FIG. 3, only one of the flash fuse cells that is connected to a particular bit line (e.g., bit line b1) is used as a fuse cell, as the fuse sense amplifying circuit 100 cannot simultaneously read two information items.

Since the first fusing circuit 210, the second fusing circuit 220, and the third fusing circuit 230 respectively include a word line and a source line, the entire flash fuse cells of each fusing circuit may be simultaneously programmed and/or erased. In addition, since only one flash fuse cell of the six flash fuse cells connected to each respective bit line in the embodiment of FIG. 3 is used as a fuse cell, the flash fuse cells of the first fusing circuit 210, the second fusing circuit 220 and the third fusing circuit 230 may be sensed simultaneously.

The fuse sense amplifying unit 100 includes a sense amplifier 110 and a latch 120. The sense amplifier 110 senses and amplifies the information on the bit line b1, and then outputs the amplified information to the latch 120. The latch 120 holds the amplified information until the latch 120 receives the next amplified information.

FIG. 4 is a circuit diagram of a flash memory device according to second embodiments of the present invention. In the flash memory device of FIG. 4, if an error occurs in one of the flash fuse cells associated with a particular bit line that is not used as the fuse cell for that bit line, the effect of this error on the sensing operation for the bit line at issue may be reduced and/or eliminated.

Elements 100 and 150 in FIG. 4 may be identical to the like numbered element in FIG. 3. However, the fuse cell array 200 in the embodiment of FIG. 4 is implemented differently. In particular, the fuse cell array 300 in the embodiment of FIG. 4 further includes a first fusing circuit 310, a second fusing circuit 320 and a third fusing circuit 330 that are similar to, respectively, the first fusing circuit 210, the second fusing circuit 220 and the third fusing circuit 230 of FIG. 3, but have various differences.

In particular, in the embodiment of FIG. 3, a total of six flash fuse cells are connected to each bit line. As described above, only one of these six flash fuse cells is used as a fuse. When, for example, the flash fuse cell c01 of first fusing circuit 210 is used as the fuse, the remaining flash fuse cells connected to bit line b1 are dummy cells that are not used as fuse cells, and the fuse sense amplifying circuit 100 senses a current of the bit line b1 connected to the flash fuse cell c01. If the gate of the other dummy flash fuse cells in the embodiment of FIG. 3 become deteriorated and/or over-erased, the dummy flash fuse cells may produce leakage currents. When this occurs, the current of the bit line is based on both the value of the information of the flash fuse cell c01 and the magnitude of the leakage currents. If the leakage currents are high enough, the fuse sense amplifying circuit 100 may sense the wrong information.

In the embodiment of FIG. 4, the bit line b1 is only connected to the flash fuse cell c01 that is used as the fuse cell for the first fusing circuit 310, and the remaining flash fuse cells that share the bit line b1 are not connected to the bit line b1. In particular, as shown in FIG. 4, while the drain of the flash fuse cell c01 (i.e., the flash fuse cell that is used as the fuse cell) of the first fusing circuit 310 is connected to the bit line b1, the drains of the remaining dummy flash fuse cells are not connected to the bit line b1. As a result, the bit line b1 is substantially connected only to the flash fuse cell c01, and thus the current flowing on the bit line b1 will be substantially based on the information of the flash fuse cell c01.

Likewise, the flash fuse cell c10 in the embodiment of FIG. 4 that is used as the fuse cell for the second fusing circuit 320 is the only flash fuse cell that is connected to bit line b0. The flash fuse cells of both the first fusing circuit 310 and the third fusing circuit 330, which share the bit line b0 with the flash fuse cell c10, are dummy flash fuse cells. Thus, only the drain of the flash fuse cell c10, which is used as the fuse cell is connected to the bit line b0, while the drains of the dummy flash fuse cells are not connected to the bit line b0. Other flash fuse cells of the second fusing circuit 320, which share a source line s1 with the flash fuse cell c10 are also dummy flash fuse cells.

Similarly, when a flash fuse cell c21023 of the third fusing circuit 330 is used as the fuse cell, a drain of the flash fuse cell c21023 is connected to the bit line b1023. The remaining flash fuse cells associated with bit line b1023 are dummy flash fuse cells and hence the drains of these dummy flash fuse cells are not connected to the bit line b1023.

As described above, only the drain of the flash fuse cell that is actually used as a fuse cell is connected to the bit line, and the drains of the dummy flash fuse cells are not connected to the bit line. A such, the possibility of incorrect operation due to leakage currents from one or more of the dummy flash fuse cells may be reduced and/or eliminated.

Pursuant to embodiments of the present invention, the first fusing circuit, the second fusing circuit and the third fusing circuit of the flash memory device may each be implemented with flash fuse cells instead of with conventional metal fuses. This may make it easier to test the flash memory because the flash fuse cells may be repeatedly programmed and erased. In addition, the flash cell array may share both bit lines and fuse sense amplifiers with the fuse cell array. As a result, the area of the fuse cell array may be reduced. Finally, according to embodiments of the present invention, the manufacturing process may be simplified because the step of cutting fuses using, for example, a laser may be eliminated.

While the example embodiments of the present invention and their advantages have been described in detail, it should be understood that various changes, substitutions and alterations may be made herein without departing from the scope of the invention.

What is claimed is:

1. A flash memory device, comprising:
   a flash cell array having a plurality of flash memory cells;
   a first flash fuse cell fusing circuit that shares bit lines with the flash cell array and that is configured to control a connection between the flash cell array and an external logic circuit;
   a second flash fuse cell fusing circuit that shares the bit lines with the flash cell array and that is configured to change an address of a defective cell of the flash cell array into an address of a redundancy cell;
   a third flash fuse cell fusing circuit that shares the bit lines with the flash cell array and is configured to control a DC level for an operation of the flash memory device; and
   a plurality of fuse sense amplifying circuits that are coupled to the bit lines, respectively.

2. The flash memory device of claim 1, wherein the first flash fuse cell fusing circuit comprises a first block of flash fuse cells having gates that are connected to a first word line, and a second block of flash fuse cells having gates that are connected to a second word line, wherein sources of the flash fuse cells of both the first block of flash fuse cells and the second block of flash fuse cells are connected to a first source line, and the second word line is connected to a reference voltage.

3. The flash memory device of claim 2, wherein the second flash fuse cell fusing circuit comprises a third block of flash fuse cells having gates that are connected to a third word line, and a fourth block of flash fuse cells having gates that are connected to a fourth word line, wherein sources of the flash fuse cells of both the third block of flash fuse cells and the fourth block of flash fuse cells are connected to a second source line, and the fourth word line is connected to the reference voltage.

4. The flash memory device of claim 3, wherein the third flash fuse cell fusing circuit comprises a fifth block of flash fuse cells having gates that are connected to a fifth word line, and a sixth block of flash fuse cells having gates that are connected to a sixth word line, wherein sources of the flash fuse cells of both the fifth block of flash fuse cells and the sixth block of flash fuse cells are connected to a third source line, and the sixth word line is connected to the reference voltage.

5. The flash memory device of claim 1, wherein each bit line is connected to only one of the flash fuse cells in the first flash fuse cell fusing circuit, the second flash fuse cell fusing circuit or the third flash fuse cell fusing circuit.

6. The flash memory device of claim 5, wherein the first flash fuse cell fusing circuit, the second flash fuse cell fusing circuit and the third flash fuse cell fusing circuit are configured to be simultaneously sensed.

7. The flash memory device of claim 5, wherein each of the fuse sense amplifying circuits comprises:
   a sense amplifier that is configured to amplify data on the at least one of the bit lines; and
   a latch that is configured to store an output of the sense amplifier.

8. A flash memory device, comprising:
   a flash cell array having a plurality of flash memory cells;
   a fuse cell array having a plurality of fusing circuits formed with flash fuse cells; and
   a plurality of bit lines that are shared by the flash cell array and the fuse cell array,
   wherein the plurality of fusing circuits comprises a first fusing circuit, a second fusing circuit and a third fusing circuit, and wherein a drain of only one of the flash fuse cells of the first fusing circuit, the second fusing circuit, and the third fusing circuit is electrically connected to the corresponding bit line that is shared by the flash cell array and the fuse cell array,
   wherein both a word line and a source line of the fusing circuits in the fuse cell array are separated, so that the flash fuse cells of each fusing circuit may be simultaneously programmed and/or erased.

9. The flash memory device of claim 8, wherein the fuse cell array comprises:
   a first fusing circuit having flash fuse cells to which a source line and at least one of a first word line and a second word line are connected, wherein the first fusing circuit is configured to control the connection between the flash cell array and the external logic circuit;
   a second fusing circuit having flash fuse cells to which a second source line and at least one of a third word line and a fourth word line are connected, wherein the second fusing circuit is configured to change an address of a defective flash fuse cell in the flash cell array into an address of a redundancy cell; and
   a third fusing circuit having flash fuse cells to which a third source line and at least one of a fifth word line and a sixth word line are connected, wherein the third fusing circuit is configured to control a DC level for an operation of the flash memory device.

10. The flash memory device of claim 8 further comprising a plurality of fuse sense amplifying circuits, respectively connected to the bit lines, that are configured to read data from the bit lines.

11. A method of configuring a flash memory device that includes a flash cell array, the method comprising:
    simultaneously activating at least some of the flash fuse cells of a first fusing circuit that is configured to control a connection between the flash cell array and an external circuit and at least some of the flash fuse cells of a second fusing circuit that is configured to change the address of a defective flash cell in the flash cell array to the address of a redundancy flash cell;

activating at least some of the flash fuse cells of a third fusing circuit that is configured to control a DC voltage level applied to internal circuits of the flash memory device; and simultaneously sensing flash fuse cells of the first fusing circuit, the second fusing circuit and the third fusing circuit.

* * * * *